(12) United States Patent
Lee

(10) Patent No.: US 8,988,943 B2
(45) Date of Patent: Mar. 24, 2015

(54) SEMICONDUCTOR MEMORY DEVICE AND OPERATING METHOD THEREOF

(75) Inventor: Hee Youl Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 265 days.

(21) Appl. No.: 13/605,757

(22) Filed: Sep. 6, 2012

(65) Prior Publication Data
US 2013/0235671 A1 Sep. 12, 2013

(30) Foreign Application Priority Data

Mar. 6, 2012 (KR) .................. 10-2012-0022922

(51) Int. Cl.
*G11C 11/34* (2006.01)
*G11C 16/04* (2006.01)
*G11C 16/10* (2006.01)
*G11C 16/34* (2006.01)

(52) U.S. Cl.
CPC ............ *G11C 16/0483* (2013.01); *G11C 16/10* (2013.01); *G11C 16/3427* (2013.01)
USPC ................. 365/185.18; 365/185.05; 365/195; 365/189.16

(58) Field of Classification Search
CPC .......... G11C 16/10; G11C 16/12; G11C 16/30
USPC ................... 365/185.18, 185.05, 195, 189.16
See application file for complete search history.

(56) References Cited

U.S. PATENT DOCUMENTS 8,050,097 B2 * 11/2011 Wang ........................ 365/185.18
8,085,602 B2 * 12/2011 Yang et al. ............... 365/189.05
8,102,712 B2 * 1/2012 Goda et al. ............... 365/185.17

* cited by examiner

*Primary Examiner* — Son Dinh
(74) *Attorney, Agent, or Firm* — IP & T Group LLP

(57) ABSTRACT

A semiconductor memory device and a method of operating a semiconductor memory device includes connecting selected even bit lines to selected even cell strings, programming memory cells in the selected even cell strings by using a second program permission voltage higher than a first program permission voltage, connecting selected odd bit lines to selected odd cell strings when programming of the memory cells is finished, and programming memory cells in the selected odd cell strings by using the first program permission voltage.

22 Claims, 7 Drawing Sheets

SEMICONDUCTOR MEMORY DEVICE AND OPERATING METHOD THEREOF

CROSS-REFERENCE TO RELATED APPLICATIONS

This application claims priority from Korean Patent Application No. 10-2012-0022922, filed on Mar. 6, 2012, the contents of which are incorporated herein by reference in its entirety.

BACKGROUND MODE OF THE INVENTION

The present invention relates to a semiconductor memory device and an operating method thereof, and more particularly, relates to a program method of a semiconductor memory device.

A semiconductor memory device includes memory cell blocks having cell strings. Each of the cell strings includes plural memory cells connected in serial. The cell strings in the memory cell block are disposed in parallel. To increase integrity of the semiconductor memory device, an interval between memory cells included in the same cell string and another interval between memory cells included in different cell strings are reduced.

According as interval between the memory cells reduces, interference between adjoining memory cells may increase when the program operation is performed.

To prevent the interference between adjoining the memory cells, the program operation is performed at a separated unit of cell string. Generally, cell strings disposed in an order of even number are referred to as an even cell string. Cell strings disposed in an order of odd number are defined as an odd cell string. For example, an program operation is usually performed at the odd cell strings after another program operation at the even cell strings. At the even cell strings, an program operation may be performed after another program operation at the odd cell strings.

Hereinafter, an program operation will be described in a case when the program operation is performed at the odd cell strings after another program operation is performed at the even cell strings.

When a program operation starts, an erase operation is performed in selected memory cell block. Subsequently, the program operation is performed at the even cell strings under the condition that every memory cell included in odd cell strings maintains erase state. Then, when another program operation is performed at the odd cell strings, most of memory cells included in the even cell strings are already programmed. Accordingly, amount of interference between adjoining memory cells or adjacent cell strings may be different based on which the program operation is performed at, the even cell strings or the odd cell strings. Accordingly, program velocity of the even cell strings and the odd cell strings may be different. Threshold voltage distribution of the memory cells included in selected memory cell block may be wide. Thus, reliability of the program operation may be deteriorated.

SUMMARY OF THE INVENTION

Exemplary embodiments of the present invention provide a semiconductor memory device for improving reliability of program operation and operating method thereof.

A method of operating a semiconductor memory device according to one embodiment of the present invention includes connecting selected even bit lines to selected even cell strings, programming memory cells in the selected even cell strings by using a second program permission voltage higher than a first program permission voltage; connecting selected odd bit lines to selected odd cell strings when programming of the memory cells is finished; and programming memory cells in the selected odd cell strings by using the first program permission voltage.

A method of operating a semiconductor memory device according to another embodiment of the present invention includes programming memory cells in selected even cell strings by applying a second program voltage which is lower than a first program voltage to selected word line; and programming memory cells in selected odd cell strings by applying the first program voltage to the selected word line, when programming of the memory cells in the selected even cell strings is finished.

A semiconductor memory device according to one embodiment of the present invention includes a memory cell array configured to include even cell strings and odd cell strings; a circuit group configured to program memory cells selected from the even cell strings and the odd cell strings; and a control circuit configured to control the circuit group to reduce difference of channel potentials of the even cell strings and the odd cell strings during a program operation.

The present invention may prevent deterioration of reliability of program operation though integrity of a semiconductor memory device increases.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1:
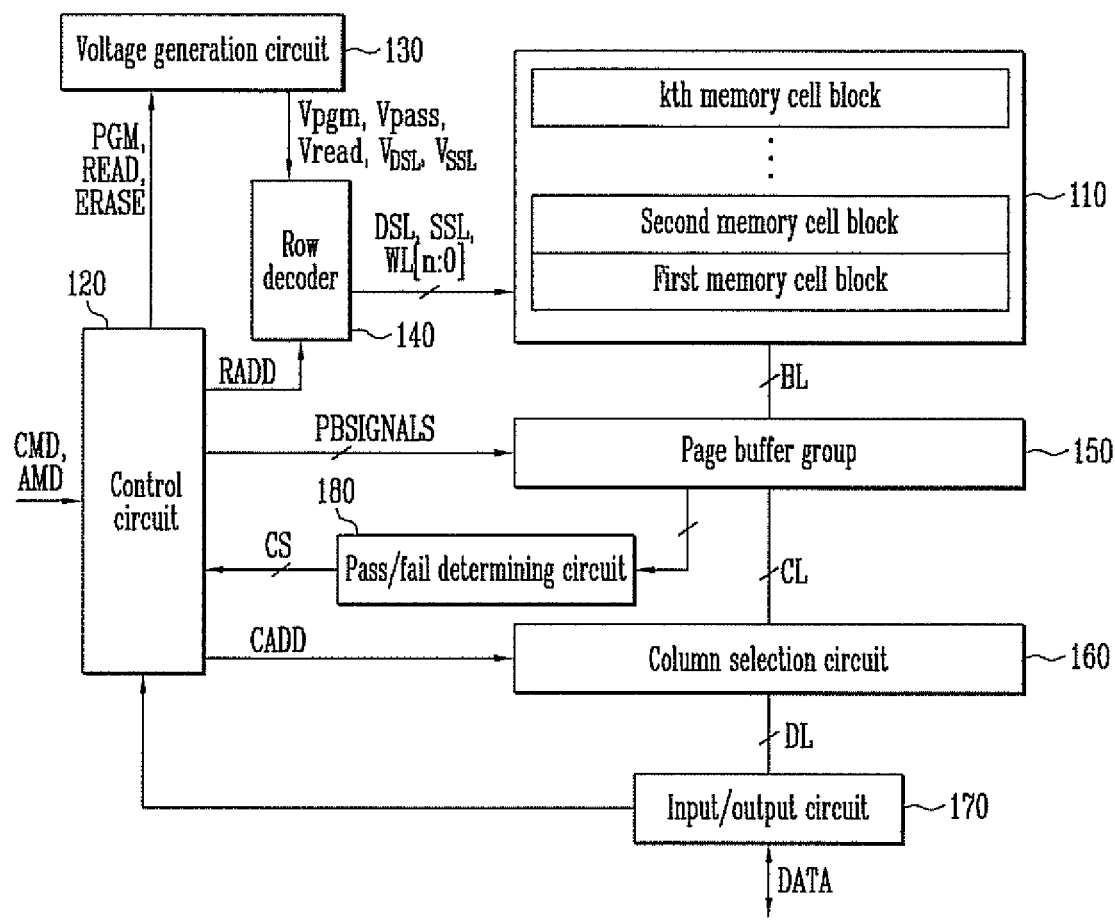
FIG. 1 is a block diagram illustrating schematically a semiconductor memory device for describing a program operation according to one exemplary embodiment of the present invention.

FIG. 1 is a block diagram illustrating schematically a semiconductor memory device for describing a program operation according to one exemplary embodiment of the present invention.

In FIG. 1, a semiconductor memory device includes a memory cell array 110, a circuit group 130, 140, 150, 160, 170, and 180 for performing a program operation, a read operation and an erase operation of memory cells in the memory cell array 110, and a control circuit 120 for controlling the circuit group 130, 140, 150, 160, 170, and 180 to set threshold voltage levels of selected memory cells according to input data.

In a case when the semiconductor memory device is an NAND flash memory device, the circuit group includes a voltage generation circuit 130, a row decoder 140, a page buffer group 150, a column selection circuit 160, an input/output circuit 170, and a pass/fail determining circuit 180.

The memory cell array 110 includes first to $k^{th}$ memory cell blocks having the same constitution. Herein, k is an even number. The memory cell block has plural cell strings including memory cells. Detailed constitution of the memory cell block will be described with reference to accompanying drawing FIG. 2.

The control circuit 120 controls the circuit group 130, 140, 150, 160, 170, and 180 so that channel potential of even cell strings is similar to that of odd cell strings. For example, in a case when a program operation for the even cell strings is performed before a program operation of the odd cell strings is performed, the control circuit 120 controls the circuit group 130, 140, 150, 160, 170, and 180 so that the channel potential of the even cell strings is similar to that of the odd cell strings, during the program operation, by decreasing the channel potential of the even cell strings when the program operation for the even cell strings is performed. The control circuit 120 controls the circuit group 130, 140, 150, 160, 170, and 180 to provide various operation voltages (e.g., a program voltage, a program pass voltage, a voltage applied to a bit line, or a voltage provided to a selected transistor) to the even cell strings in the program operation.

Additionally, the control circuit 120 outputs internally a program operation signal PGM, a read operation signal READ, or an erase operation signal ERASE, in response to a command signal CMD. The control circuit 120 outputs page buffer signals PBSIGNALS for controlling page buffers included in the page buffer group 150 according to kind of the operation. Furthermore, the control circuit 120 outputs internally a row address RADD or a column address CADD in response to an address signal ADD. The control circuit 120 determines re-performing, completion, or failure of the program operation and the erase operation, by verifying whether or not threshold voltages of selected memory cells are higher than a target voltage according to a check signal CS outputted from the pass/fail determining circuit 180 when the program operation or the erase operation is performed.

The voltage generation circuit 130 outputs the operation voltages, e.g., Vpgm, Vpass, Vread, $V_{DSL}$, and $V_{SSL}$ for programming, reading, or erasing the memory cells to global lines in response to the operation signals PGM, READ, and ERASE which are internal command signals of the control circuit 120. When the memory cells are programmed, the voltage generation circuit 130 outputs the program voltage Vpgm, the program pass voltage Vpass, a drain turn-on voltage $V_{DSL}$, and a source turn-on voltage $V_{SSL}$ to the global lines.

The row decoder 140 delivers the operation voltages outputted from the voltage generation circuit 130 to local lines DSL, SSL, and WL[n:0] in a selected memory cell block, in response to the row address signals RADD of the control circuit 120.

The page buffer group 150 includes page buffers connected to bit lines BL. The page buffer group 150 applies a voltage needed for storing data in the memory cells to the bit lines BL in response to the page buffer signals PBSIGNALS outputted from the control circuit 120. For example, the page buffer group 150 precharges the bit lines BL in the program operation, the read operation, or the erase operation of the memory cells. The page buffer group 150 also latches data corresponding to threshold voltage level of the memory cells detected according to voltage change of the bit lines BL. That is, the page buffer group 150 applies a program permission voltage or a program prohibition voltage to the bit lines BL according to data inputted in a latch in the program operation. The page buffer group 150 further detects data stored in the memory cells by adjusting a voltage of the bit lines BL according to the data stored in the memory cells in the read operation.

The column selection circuit 160 selects the page buffers included in the page buffer group 150 through a column line CL in response to the column address CADD outputted from the control circuit 120. Data latched in the page buffer selected by the column selection circuit 160 is outputted.

The input/output circuit 170 delivers data DATA to the column selection circuit 160 according to control of the control circuit 120 to transmit the data DATA inputted from outside to each of the page buffers of the page buffer group 150. In a case when the column selection circuit 160 transmits the delivered data in sequence to the page buffers of the page buffer group 150, the page buffers hold the transmitted data in an internal latch. In addition, the input/output circuit 170 outputs data DATA delivered from the page buffers of the page buffer group 150 through the column selection circuit 160 when the read operation is performed.

The pass/fail determining circuit 180 checks whether or not error cells occur in a verifying operation performed after the program operation or the erase operation is performed. The pass/fail determining circuit 180 transmits a check signal CS generated in accordance with the checked result to the control circuit 120.

Figure 2:
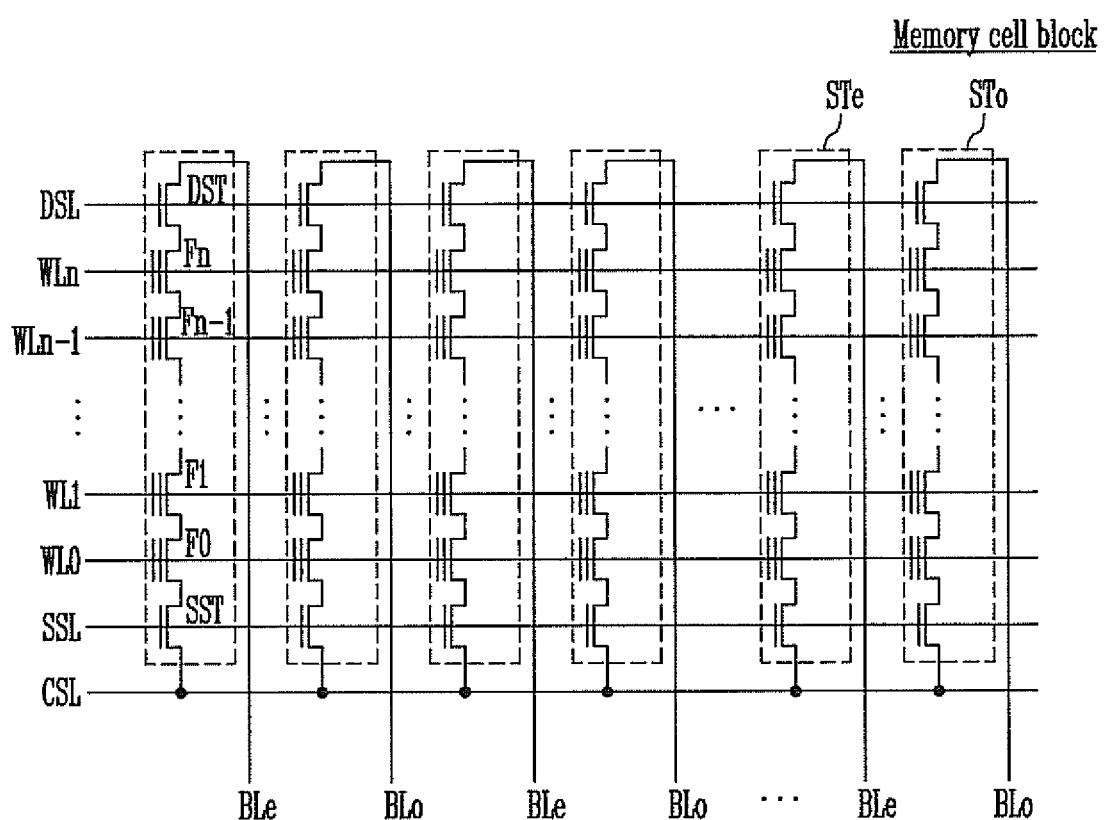
FIG. 2 is a diagram illustrating a memory cell block shown in FIG. 1.

FIG. 2 is a diagram illustrating a memory cell block shown in FIG. 1.

A first to a $k^{th}$ memory cell blocks in FIG. 1 have the same constitution. Accordingly, the memory cell blocks will be described in detail through only one memory cell block shown in FIG. 2.

The memory cell block includes plural cell strings STe and STo. Each of the cell strings are divided into an even cell string STe or an odd cell string STo according to disposition order. The even cell strings STe are defined as cell strings in an order of even number. The odd cell strings STo are referred to as cell strings in an order of odd number.

Each of the even cell strings STe and the odd cell strings STo has the same constitution. Each cell string includes a source select transistor SST connected to a common source line CSL, memory cells F0 to Fn, and a drain select transistor DST connected to bit lines BLe or BLo. A bit line connected to the even cell string STe is referred to as an even bit line BLe. Another bit line connected to the odd cell string STo is defined as an odd bit line BLo.

A gate of the source select transistor SST included in each of the even and the odd cell strings STe and STo is connected to a source select line SSL. Gates of the memory cells F0 to Fn are respectively connected to word lines WL0 to WLn. A gate of the drain select transistor DST is connected to a drain select line DSL.

Hereinafter, a program method of the above semiconductor memory device will be described in detail. The program method will be described through a case that a program operation for the odd cell strings STo connected to the odd bit lines BLo is performed after a program operation for the even cell strings STe connected to the even bit lines BLe is performed.

Figure 3A:
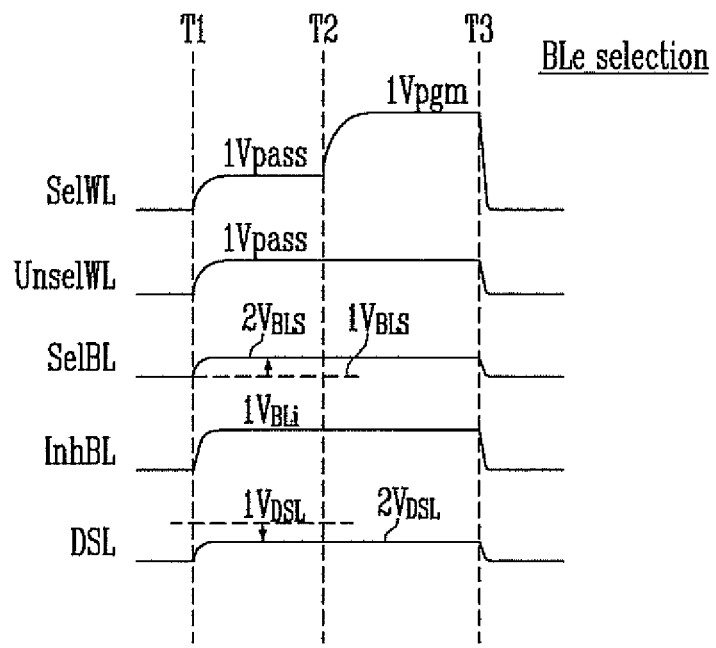
FIG. 3A and FIG. 3B are timing diagrams illustrating a program method according to a first exemplary embodiment of the present invention.
Figure 3B:
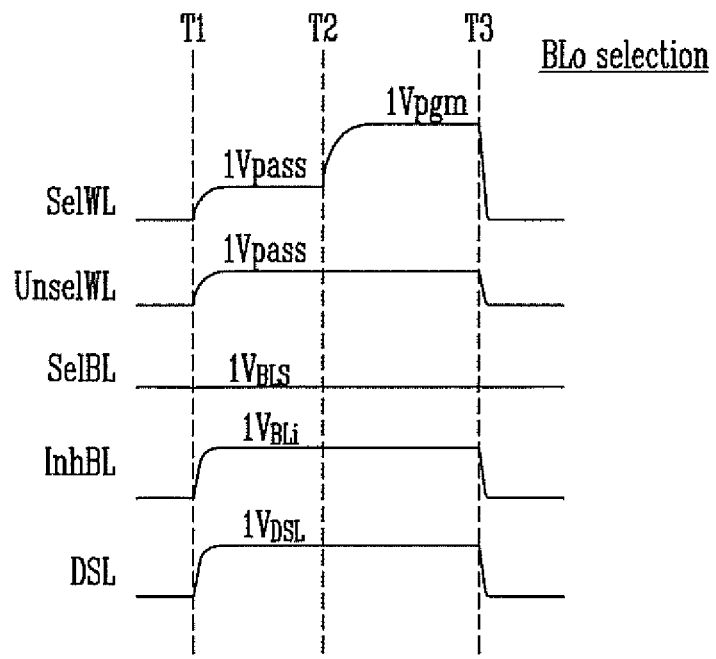

FIG. 3A and FIG. 3B are timing diagrams illustrating a program method according to a first exemplary embodiment of the present invention.

Hereinafter, a program operation for the even cell strings STe connected to the even bit lines BLe will be described with reference to accompanying drawing FIG.

Channel Forming Section T1 to T2

In the channel forming section T1 to T2, a second program permission voltage $2V_{BLS}$ higher than a first program permission voltage $1V_{BLS}$ is applied to selected bit lines SelBL connected to memory cells to be programmed to decrease channel potential of the even cell strings STe. A first program prohibition voltage $1V_{BLi}$ is provided to bit lines InhBL not selected and connected to memory cells not programmed. Since the program operation corresponds to a program operation for the even cell strings STe, the selected bit lines SelBL include a bit line connected to the memory cells to be programmed of the even bit lines BLe. The bit lines InhBL not selected have the other even bit lines BLe and every odd bit line BLo. For example, the first program permission voltage $1V_{BLS}$ may be level of a ground voltage. The first program prohibition voltage $1V_a$ may be level of a supply voltage Vcc. The second program permission voltage $2V_{BLS}$ may have level higher than the first program permission voltage $1V_{BLS}$ by difference of channel voltage between the even cell strings STe and the odd cell strings STo in the program operation.

To form a channel to the even cell strings STe, a first program pass voltage 1Vpass is applied to a selected word line SelWL, which is connected to the memory cells to be programmed, and the other word lines UnselWL which is connected to the memory cells not programmed.

To deliver a voltage applied to the bit lines BLe and BLo to the cell strings STe and STo, a first drain turn-on voltage $1V_{DSL}$ or a second drain turn-on voltage $2V_{DSL}$, which is lower than the first drain turn-on voltage $1V_{DSL}$ and higher than 0V, is provided to the drain select line DSL. For example, the second drain turn-on voltage $2V_{DSL}$ may be level lower than the first drain turn-on voltage $1V_{DSL}$ by difference of channel voltage between the even cell strings STe and the odd cell strings STo in the program operation.

In a case when a voltage corresponding to level of the ground voltage is applied to the common source line CSL in the program operation, a voltage corresponding to the level of the ground voltage is provided to the source select line SSL. In a case when a voltage corresponding to level of the supply voltage is applied to the common source line CSL, a voltage corresponding to the level of the supply voltage is provided to the source select line SSL.

Program Section T2 to T3

In a program section T2 to T3, a first program voltage 1Vpgm higher than the first program pass voltage 1Vpass is applied to the selected word line SelWL. A threshold voltage of selected memory cells increases.

A program verifying operation is performed after operation in the program section T2 to T3 is finished, which is not shown. In a case when the threshold voltage of the selected memory cells is not higher than a target voltage in the verifying operation, the present invention performs repetitively the operation in the channel forming section T1 to T2 in FIG., the operation in the program section T2 to T3 in FIG., and the program verifying operation for the even cell strings with increasing step-by-step the first program voltage 1Vpgm by a step voltage. In a case when the threshold voltage of the selected memory cells included in the even cell strings STe and connected to the selected word line SelWL is higher than the target voltage, a program operation is performed about selected memory cells in the odd cell strings STo.

Hereinafter, the program operation for the odd cell strings STo connected to the odd bit lines no will be described with reference to accompanying drawing FIG. 3B.

Channel Forming Section T1 to T2

In the channel forming section T1 to T2, a first program permission voltage $1V_{BLS}$ is applied to selected bit lines SelBL connected to memory cells to be programmed to down channel potential of the odd cell strings STo. A first program prohibition voltage $1V_{BLi}$ is provided to bit lines InhBL not selected and connected to memory cells not programmed. Since the program operation corresponds to a program operation for the odd cell strings STo, the selected bit lines SelBL are referred to as a bit line connected to the memory cells to be programmed of the odd bit lines BLo. The bit lines InhBL not selected have the other odd bit lines BLo and every even bit line BLe. For example, the first program permission voltage $1V_{BLS}$ may be level of a ground voltage. The first program prohibition voltage $1V_{BLi}$ may be level of a supply voltage Vcc.

To form a channel to the odd cell strings STo, a first program pass voltage 1Vpass is applied to a selected word line SelWL, which is connected to the memory cells to be programmed, and the other word lines UnselWL which is connected to the memory cells not programmed. To deliver a voltage applied to the bit lines BLe and BLo to the cell strings STe and STo, a first drain turn-on voltage $1V_{DSL}$ is provided to the drain select line DSL.

In a case when a voltage corresponding to level of the ground voltage is applied to the common source line CSL in the program operation, a voltage corresponding to the level of the ground voltage is provided to the source select line SSL. In a case when a voltage corresponding to level of the supply voltage is applied to the common source line CSL, a voltage corresponding to the level of the supply voltage is provided to the source select line SSL.

Program Section T2 to T3

In a program section T2 to T3, a first program voltage 1Vpgm higher than the first program pass voltage 1Vpass is applied to the selected word line SelWL. A threshold voltage of selected memory cells increases.

A program verifying operation is performed after operation in the program section T2 to T3 is finished, which is not shown. In a case when the threshold voltage of the selected memory cells is not higher than a target voltage in the verifying operation, the present invention performs repetitively the operation in the channel forming section T1 to T2 in FIG. 3B, the operation in the program section T2 to T3 in FIG. 3B, and the program verifying operation for the odd cell strings with increasing step-by-step the first program voltage 1Vpgm by a step voltage. In a case when the threshold voltage of the selected memory cells, included in the odd cell strings STo and connected to the selected word line SelWL, is higher than the target voltage, the next word line is selected. The program operation is performed about memory cells connected to the selected word line like the above method.

Figure 4A:
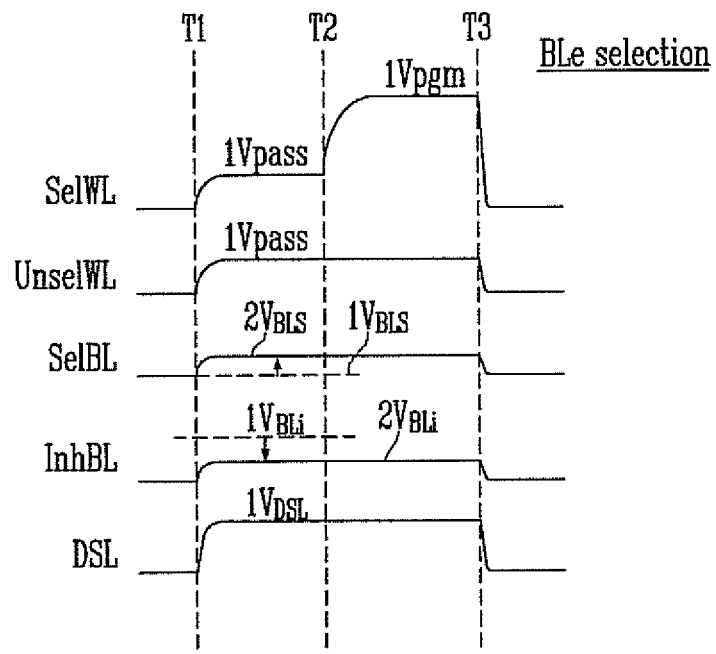
FIG. 4A and FIG. 4B are timing diagrams illustrating a program method according to a second exemplary embodiment of the present invention.
Figure 4B:
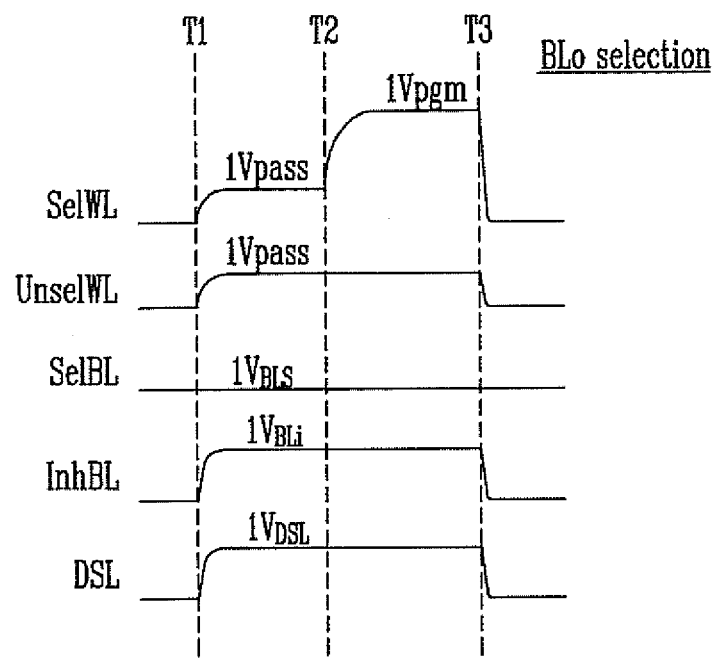

FIG. 4A and FIG. 4B are timing diagrams illustrating a program method according to a second exemplary embodiment of the present invention.

Hereinafter, a program operation for the even cell strings STe connected to the even bit lines BLe will be described with reference to accompanying drawing FIG. 4A.

Channel Forming Section T1 to T2

In the channel forming section T1 to T2, a second program permission voltage $2V_{BLS}$ higher than a first program permission voltage $1V_{BLS}$ is applied to selected bit lines SelBL connected to memory cells to be programmed to down channel potential of the even cell strings STe. A second program prohibition voltage $2V_{BLi}$ lower than a first program prohibition voltage $1V_{BLi}$ is provided to bit lines InhBL not selected and connected to memory cells not programmed. Since the program operation corresponds to a program operation for the even cell strings STe, the selected bit lines SelBL include bit lines connected to the memory cells to be programmed of the even bit lines BLe. The bit lines InhBL not selected have the other even bit lines BLe and every odd bit line BLo. For example, the first program permission voltage $1V_{BLS}$ may be level of a ground voltage. The first program prohibition voltage $1V_{BLi}$ may be level of a supply voltage Vcc. The second program permission voltage $2V_{BLS}$ may have level higher than the first program permission voltage $1V_{BLS}$ by difference of channel voltage between the even cell strings STe and the odd cell strings STo in the program operation. The second program prohibition voltage $2V_{BLi}$ may have level lower than the first program prohibition voltage $1V_{BLi}$ by difference of channel voltage between the even cell strings STe and the odd cell strings STo and higher than 0V in the program operation.

To form a channel to the even cell strings STe, a first program pass voltage 1Vpass is applied to a selected word line SelWL, which is connected to the memory cells to be programmed, and the other word lines UnselWL which is connected to the memory cells not programmed.

To deliver a voltage applied to the bit lines BLe and BLo to the cell strings STe and STo, a first drain turn-on voltage $1V_{DSL}$ or a second drain turn-on voltage $2V_{DSL}$, which is lower than the first drain turn-on voltage $1V_{DSL}$ and higher than 0V, is provided to the drain select line DSL. For example, the second drain turn-on voltage $2V_{DSL}$ may be level lower than the first drain turn-on voltage $1V_{DSL}$ by difference of channel voltage between the even cell strings STe and the odd cell strings STo in the program operation.

In a case when a voltage corresponding to level of the ground voltage is applied to the common source line CSL in the program operation, a voltage corresponding to the level of the ground voltage is provided to the source select line SSL. In a case when a voltage corresponding to level of the supply voltage is applied to the common source line CSL, a voltage corresponding to the level of the supply voltage is provided to the source select line SSL.

Program Section T2 to T3

In a program section T2 to T3, a first program voltage 1Vpgm higher than the first program pass voltage 1Vpass is applied to the selected word line SelWL. A threshold voltage of selected memory cells increases.

A program verifying operation is performed after operation in the program section T2 to T3 is finished, which is not shown. In a case when the threshold voltage of the selected memory cells is not higher than a target voltage in the verifying operation, the present invention performs repetitively the operation in the channel forming section T1 to T2 in FIG. 4A, the operation in the program section T2 to T3 in FIG. 4A, and the program verifying operation for the even cell strings with increasing step-by-step the first program voltage 1Vpgm by a step voltage. In a case when the threshold voltage of the selected memory cells, included in the even cell strings STe and connected to the selected word line SelWL, is higher than the target voltage, a program operation is performed about selected memory cells in the odd cell strings STo.

Hereinafter, the program operation for the odd cell strings STo connected to the odd bit lines BLo will be described with reference to accompanying drawing FIG. 4B.

Channel Forming Section T1 to T2

In the channel forming section T1 to T2, a first program permission voltage $1V_{BLS}$ is applied to selected bit lines SelBL connected to memory cells to be programmed. A first program prohibition voltage $1V_{BLi}$ is provided to bit lines InhBL not selected and connected to memory cells not programmed. Since the program operation corresponds to a program operation for the odd cell strings STo, the selected bit lines SelBL are referred to as a bit line connected to the memory cells to be programmed of the odd bit lines BLo. The bit lines InhBL not selected have the other odd bit lines BLo and every even bit line BLe. For example, the first program permission voltage $1V_{BLS}$ may be level of a ground voltage. The first program prohibition voltage $1V_{BLi}$ may be level of a supply voltage Vcc.

To form a channel to the odd cell strings STo, a first program pass voltage 1Vpass is applied to a selected word line SelWL, which is connected to the memory cells to be programmed, and the other word lines UnselWL which is connected to the memory cells not programmed. To deliver a voltage applied to the bit lines BLe and BLo to the cell strings STe and STo, a first drain turn-on voltage $1V_{DSL}$ is provided to the drain select line DSL.

In a case when a voltage corresponding to level of the ground voltage is applied to the common source line CSL in the program operation, a voltage corresponding to the level of the ground voltage is provided to the source select line SSL. In a case when a voltage corresponding to level of the supply voltage is applied to the common source line CSL, a voltage corresponding to the level of the supply voltage is provided to the source select line SSL.

Program Section T2 to T3

In a program section T2 to T3, a first program voltage 1Vpgm higher than the first program pass voltage 1Vpass is applied to the selected word line SelWL. A threshold voltage of selected memory cells increases.

A program verifying operation is performed after operation in the program section T2 to T3 is finished, which is not shown. In a case when it is verified through the verifying operation that the threshold voltage of the selected memory cells is not higher than a target voltage, the present invention performs repetitively the operation in the channel forming section T1 to T2 in FIG. 4B, the operation in the program section T2 to T3 in FIG. 4B, and the program verifying operation for the odd cell strings with increasing step-by-step the first program voltage 1Vpgm by a step voltage. In a case when the threshold voltage of the selected memory cells, included in the odd cell strings STo and connected to the selected word line SelWL, is higher than the target voltage, the next word line is selected. The program operation is performed about memory cells connected to the selected word line like the above method.

Figure 5A:
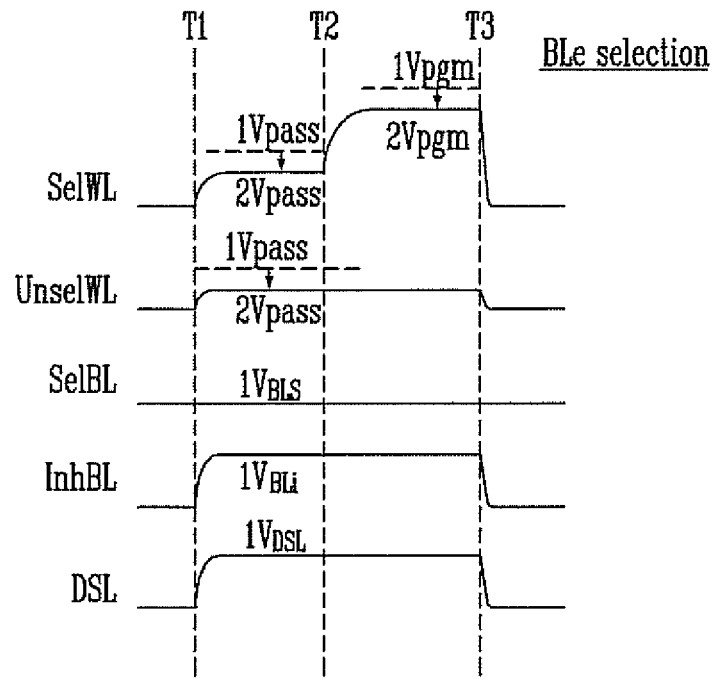
FIG. 5A and FIG. 5B are timing diagrams illustrating a program method according to a third exemplary embodiment of the present invention.
Figure 5B:
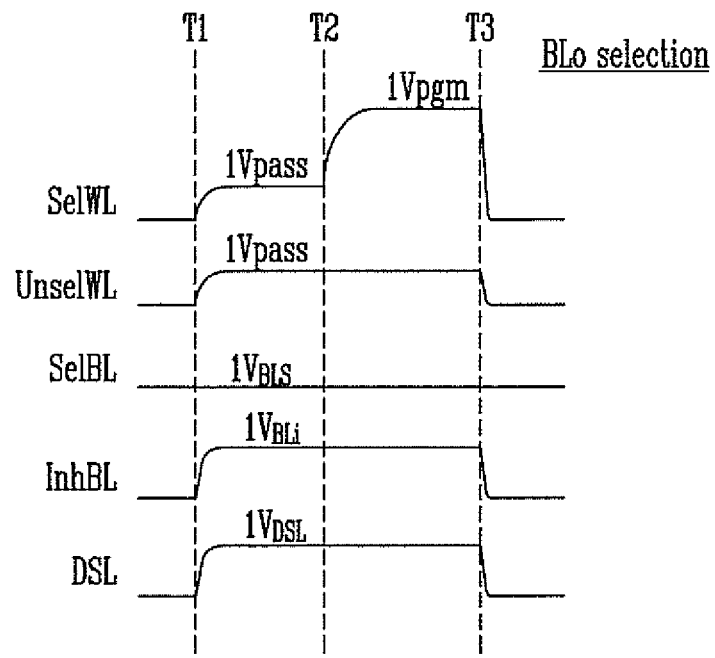

FIG. 5A and FIG. 5B are timing diagrams illustrating a program method according to a third exemplary embodiment of the present invention.

Hereinafter, a program operation for the even cell strings STe connected to the even bit lines BLe will be described with reference to accompanying drawing FIG. 5A.

Channel Forming Section T1 to T2

In the channel forming section T1 to T2, a first program permission voltage $1V_{BLS}$ is applied to selected bit lines SelBL connected to memory cells to be programmed. A first program prohibition voltage $1V_{BLi}$ is provided to bit lines InhBL not selected and connected to memory cells not programmed. Since the program operation corresponds to a program operation for the even cell strings STe, the selected bit lines SelBL include bit lines connected to the memory cells to be programmed of the even bit lines BLe. The bit lines InhBL not selected have the other even bit lines BLe and every odd bit line BLo. For example, the first program permission voltage $1V_{BLS}$ may be level of a ground voltage. The first program prohibition voltage $1V_{BLi}$ may be level of a supply voltage Vcc.

To decrease channel potential of the even cell strings STe with formation of a channel to the even cell strings STe, a second program pass voltage 2Vpass lower than a first program pass voltage 1Vpass is applied to a selected word line SelWL, which is connected to the memory cells to be programmed, and the other word lines UnselWL which is connected to the memory cells not programmed. For example, the second program pass voltage 2Vpass may be a voltage between the first program pass voltage 1Vpass and the ground voltage Vss. The second program pass voltage 2Vpass may have level lower than the first program pass voltage 1Vpass by channel voltage between the even cell strings STe and the odd cell strings STo in the program operation.

To deliver a voltage applied to the bit lines BLe and BLo to the cell strings STe and STo, a first drain turn-on voltage $1V_{DSL}$ or a second drain turn-on voltage $2V_{DSL}$ in FIG. 3A, which is lower than the first drain turn-on voltage $1V_{DSL}$ and higher than 0V, is provided to the drain select line DSL. For example, the second drain turn-on voltage $2V_{DSL}$ may be level lower than the first drain turn-on voltage $1V_{DSL}$ by difference of channel voltage between the even cell strings STe and the odd cell strings STo in the program operation.

In a case when a voltage corresponding to level of the ground voltage is applied to the common source line CSL in the program operation, a voltage corresponding to the level of the ground voltage is provided to the source select line SSL. In a case when a voltage corresponding to level of the supply voltage is applied to the common source line CSL, a voltage corresponding to the level of the supply voltage is provided to the source select line SSL.

Program Section T2 to T3

In a program section T2 to T3, a second program voltage 2Vpgm higher than the first program pass voltage 1Vpass is applied to the selected word line SelWL to decrease channel voltage of the even cell strings STe. A threshold voltage of selected memory cells increases. For example, the second program voltage 2Vpgm may be higher than the first program pass voltage 1Vpass and lower than a first program voltage 1Vpgm. Particularly, the second program voltage 2Vpgm may have level lower than the first program voltage 1Vpgm by difference of channel voltage between the even cell strings STe and the odd cell strings STo in the program operation.

A program verifying operation is performed after operation in the program section T2 to T3 is finished, which is not shown. In a case when the threshold voltage of the selected memory cells is not higher than a target voltage in the verifying operation, the present invention performs repetitively the operation in the channel forming section T1 to T2 in FIG. 5A, the operation in the program section T2 to T3 in FIG. 5A, and the program verifying operation for the even cell strings with increasing step-by-step the first program voltage 1Vpgm by a step voltage. In a case when the threshold voltage of the selected memory cells, which are included in the even cell strings STe and connected to the selected word line SelWL, is higher than the target voltage, a program operation is performed at selected memory cells in the odd cell strings STo.

Hereinafter, the program operation for the odd cell strings STo connected to the odd bit lines BLo will be described with reference to accompanying drawing FIG. 5B.

Channel Forming Section T1 to T2

In the channel forming section T1 to T2, a first program permission voltage $1V_{BLS}$ is applied to selected bit lines SelBL connected to memory cells to be programmed. A first program prohibition voltage $1V_{BLi}$ is provided to bit lines InhBL not selected and connected to memory cells not programmed. Since the program operation corresponds to a program operation for the odd cell strings STo, the selected bit lines SelBL are referred to as a bit line connected to the memory cells to be programmed of the odd bit lines BLo. The bit lines InhBL not selected have the other odd bit lines BLo and every even bit line BLe. For example, the first program permission voltage $1V_{BLS}$ may be level of a ground voltage Vss. The first program prohibition voltage $1V_{BLi}$ may be level of a supply voltage Vcc.

To form a channel to the odd cell strings STo, a first program pass voltage 1Vpass is applied to a selected word line SelWL, which is connected to the memory cells to be programmed, and the other word lines UnselWL which is connected to the memory cells not programmed. To deliver a voltage applied to the bit lines BLe and BLo to the cell strings STe and STo, a first drain turn-on voltage $1V_{DSL}$ is provided to the drain select line DSL. For example, the first drain turn-on voltage $1V_{DSL}$ may be a voltage corresponding to the supply voltage Vcc.

In a case when a voltage corresponding to level of the ground voltage is applied to the common source line CSL in the program operation, a voltage corresponding to the level of the ground voltage is provided to the source select line SSL. In a case when a voltage corresponding to level of the supply voltage is applied to the common source line CSL, a voltage corresponding to the level of the supply voltage is provided to the source select line SSL.

Program Section T2 to T3

In a program section T2 to T3, a first program voltage 1Vpgm higher than the first program pass voltage 1Vpass is applied to the selected word line SelWL. A threshold voltage of selected memory cells increases.

A program verifying operation is performed after operation in the program section T2 to T3 is finished, which is not shown. In a case when the threshold voltage of the selected memory cells is not higher than a target voltage in the verifying operation, the present invention performs repetitively the operation in the channel forming section T1 to T2 in FIG. 5B, the operation in the program section T2 to T3 in FIG. 5B, and the program verifying operation for the odd cell strings with increasing step-by-step the first program voltage 1Vpgm by a step voltage. In a case when the threshold voltage of the selected memory cells, which are included in the odd cell strings STo and connected to the selected word line SelWL, is higher than the target voltage, next word line is selected. The program operation is performed at memory cells connected to the selected word line, like the above method.

Figure 6A:
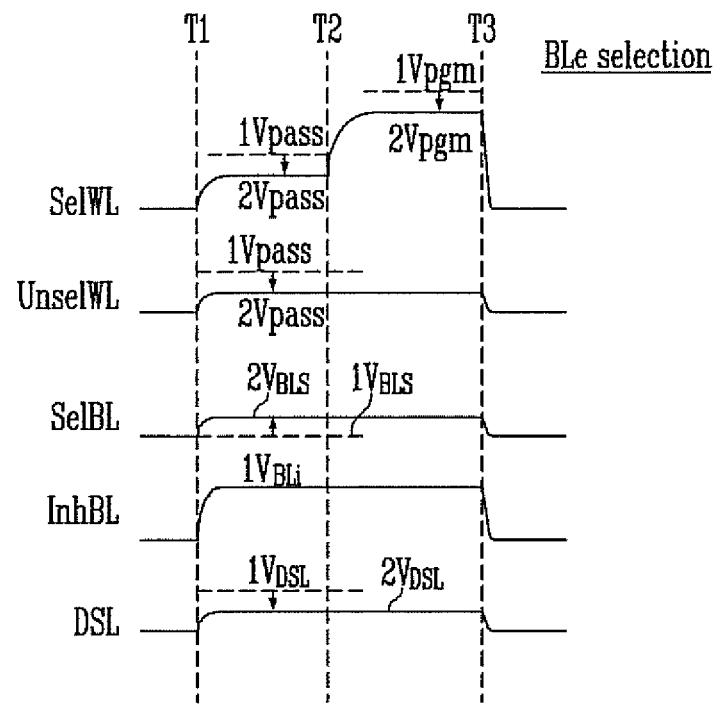
FIG. 6A and FIG. 6B are timing diagrams illustrating a program method according to a fourth exemplary embodiment of the present invention.
Figure 6B:
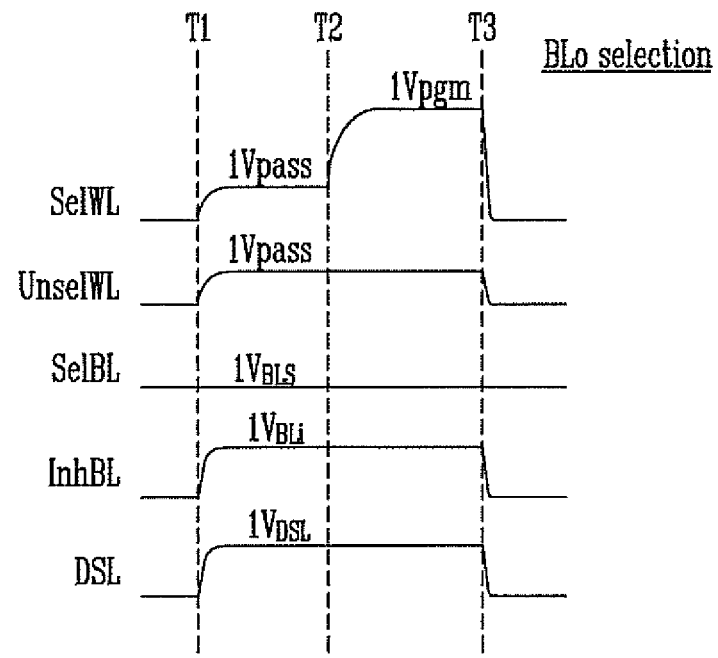

FIG. 6A and FIG. 6B are timing diagrams illustrating a program method according to a fourth exemplary embodiment of the present invention.

Hereinafter, a program operation for the even cell strings STe connected to the even bit lines BLe will be described with reference to accompanying drawing FIG. 6A.

Channel Forming Section T1 to T2

In the channel forming section T1 to T2, to decrease channel potential of the even cell strings STe, a second program permission voltage $2V_{BLS}$ higher than a first program permission voltage $1V_{BLS}$ is applied to selected bit lines SelBL which is connected to memory cells to be programmed. A first program prohibition voltage $1V_{BLi}$ is provided to bit lines InhBL not selected and connected to memory cells not programmed. Since the program operation corresponds to a program operation for the even cell strings STe, the selected bit lines SelBL include bit lines connected to the memory cells to be programmed of the even bit lines BLe. The bit lines InhBL not selected have the other even bit lines BLe and every odd bit line BLo. For example, the first program permission voltage $1V_{BLS}$ may be level of a ground voltage. The first program prohibition voltage $1V_{BLi}$ may be level of a supply voltage Vcc. The second program permission voltage $2V_{BLS}$ may have level higher than the first program permission voltage $1V_{BLS}$ by difference of channel voltage between the even cell strings STe and the odd cell strings STo in the program operation.

To decrease channel potential of the even cell strings STe with formation of a channel to the even cell strings STe, a second program pass voltage 2Vpass lower than a first program pass voltage 1Vpass is applied to a selected word line SelWL, which is connected to the memory cells to be programmed, and the other word lines UnselWL which is connected to the memory cells not programmed. For example, the second program pass voltage 2Vpass may be a voltage between the first program pass voltage 1Vpass and the ground voltage Vss. The second program pass voltage 2Vpass may have level lower than the first program pass voltage 1Vpass by channel voltage between the even cell strings STe and the odd cell strings STo in the program operation.

To deliver a voltage applied to the bit lines BLe and BLo to the cell strings STe and STo, a first drain turn-on voltage $1V_{DSL}$ or a second drain turn-on voltage $2V_{DSL}$ in FIG., which is lower than the first drain turn-on voltage $1V_{DSL}$ and higher than 0V, is provided to the drain select line DSL. For example, the second drain turn-on voltage $2V_{DSL}$ may be level lower than the first drain turn-on voltage $1V_{DSL}$ by difference of channel voltage between the even cell strings STe and the odd cell strings STo in the program operation.

In a case when a voltage corresponding to level of the ground voltage is applied to the common source line CSL in the program operation, a voltage corresponding to the level of the ground voltage is provided to the source select line SSL. In a case when a voltage corresponding to level of the supply voltage is applied to the common source line CSL, a voltage corresponding to the level of the supply voltage is provided to the source select line SSL.

Program Section T2 to T3

In a program section T2 to T3, a second program voltage 2Vpgm higher than the first program pass voltage 1Vpass is applied to the selected word line SelWL. A threshold voltage of selected memory cells increases.

A program verifying operation is performed after operation in the program section T2 to T3 is finished, which is not shown. In a case when the threshold voltage of the selected memory cells is not higher than a target voltage in the verifying operation, the present invention performs repetitively the operation in the channel forming section T1 to T2 in FIG. 6A, the operation in the program section T2 to T3 in FIG. 6A, and the program verifying operation for the even cell strings with increasing step-by-step the first program voltage 1Vpgm by a step voltage. In a case when the threshold voltage of the selected memory cells, which are included in the even cell strings STe and connected to the selected word line SelWL, is higher than the target voltage, a program operation is performed at selected memory cells in the odd cell strings STo.

Hereinafter, the program operation for the odd cell strings STo connected to the odd bit lines BLo will be described with reference to accompanying drawing FIG. 6B.

Channel Forming Section T1 to T2

In the channel forming section T1 to T2, a first program permission voltage $1V_{BLS}$ is applied to selected bit lines SelBL connected to memory cells to be programmed. A first program prohibition voltage $1V_{BLi}$ is provided to bit lines InhBL not selected and connected to memory cells not programmed. Since the program operation corresponds to a program operation for the odd cell strings STo, the selected bit lines SelBL are referred to as a bit line connected to the memory cells to be programmed of the odd bit lines BLo. The bit lines InhBL not selected have the other odd bit lines BLo and every even bit line BLe. For example, the first program permission voltage $1V_{BLS}$ may be level of a ground voltage Vss. The first program prohibition voltage $1V_{BLi}$ may be level of a supply voltage Vcc.

To form a channel to the odd cell strings STo, a first program pass voltage 1Vpass is applied to a selected word line SelWL, which is connected to the memory cells to be programmed, and the other word lines UnselWL which is connected to the memory cells not programmed.

To deliver a voltage applied to the bit lines BLe and BLo to the cell strings STe and STo, a first drain turn-on voltage $1V_{DSL}$ is provided to the drain select line DEL. For example, the first drain turn-on voltage $1V_{DSL}$ may be a voltage corresponding to the supply voltage Vcc.

In a case when a voltage corresponding to level of the ground voltage is applied to the common source line CSL in the program operation, a voltage corresponding to the level of the ground voltage is provided to the source select line SSL. In a case when a voltage corresponding to level of the supply voltage is applied to the common source line CSL, a voltage corresponding to the level of the supply voltage is provided to the source select line SSL.

Program Section T2 to T3

In a program section T2 to T3, a first program voltage 1Vpgm higher than the first program pass voltage 1Vpass is applied to the selected word line SelWL. A threshold voltage of selected memory cells increases.

A program verifying operation is performed after operation in the program section T2 to T3 is finished, which is not shown. In a case when the threshold voltage of the selected memory cells is not higher than a target voltage in the verifying operation, the present invention performs repetitively the operation in the channel forming section T1 to T2 in FIG. 6B, the operation in the program section T2 to T3 in FIG. 6B, and the program verifying operation for the odd cell strings with increasing step-by-step the first program voltage 1Vpgm by a step voltage. In a case when the threshold voltage of the selected memory cells, which are included in the odd cell strings STo and connected to the selected word line SelWL, is higher than the target voltage, next word line is selected. The program operation is performed at memory cells connected to the selected word line like the above method.

Figure 7A:
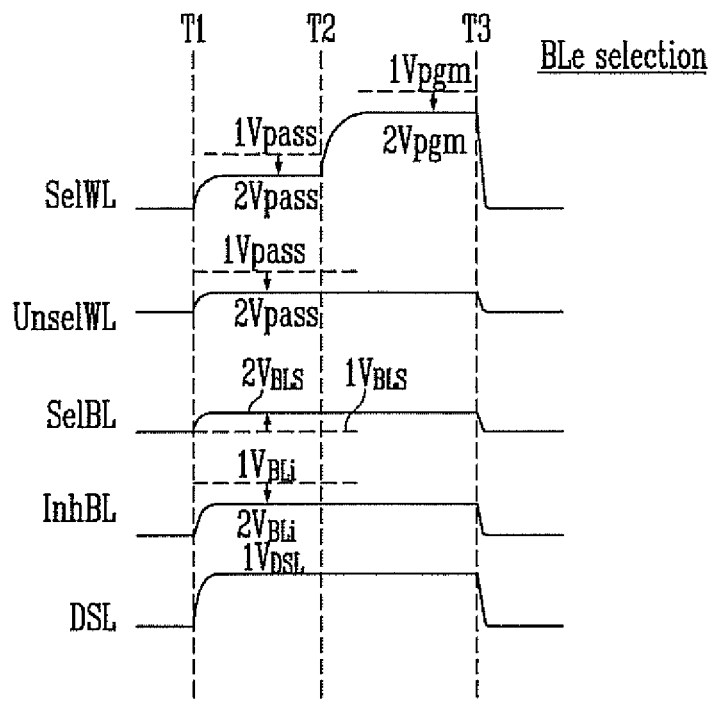
FIG. 7A and FIG. 7B are timing diagrams illustrating a program method according to a fifth exemplary embodiment of the present invention.
Figure 7B:
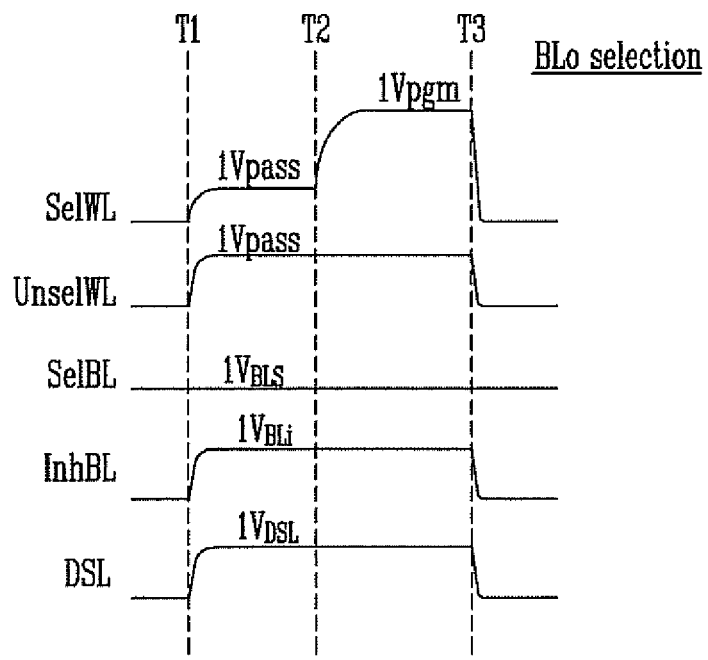

FIG. 7A and FIG. 7B are timing diagrams illustrating a program method according to a fifth exemplary embodiment of the present invention.

Hereinafter, a program operation for the even cell strings STe connected to the even bit lines BLe will be described with reference to accompanying drawing FIG. 7A.

Channel Forming Section T1 to T2

In the channel forming section T1 to T2, to decrease channel potential of the even cell strings STe, a second program permission voltage $2V_{BLS}$ higher than a first program permission voltage $1V_{BLS}$ is applied to selected bit lines SelBL which is connected to memory cells to be programmed. A second program prohibition voltage $2V_{BLi}$ lower than a first program prohibition voltage $1V_{BLi}$ is provided to bit lines InhBL not selected and connected to memory cells not programmed. Since the program operation corresponds to a program operation for the even cell strings STe, the selected bit lines SelBL include bit lines connected to the memory cells to be programmed of the even bit lines BLe. The bit lines InhBL not selected have the other even bit lines BLe and every odd bit line BLo. For example, the first program permission voltage $1V_{BLS}$ may be level of a ground voltage. The first program prohibition voltage $1V_{BLi}$ may be level of a supply voltage Vcc. The second program permission voltage $2V_{BLS}$ may have level higher than the first program permission voltage $1V_{BLS}$ by difference of channel voltage between the even cell strings STe and the odd cell strings STo in the program operation. The second program prohibition voltage $2V_{BLS}$ may be level lower than the first program prohibition voltage $1V_{BLS}$ by difference of channel voltage between the even cell strings STe and the odd cell strings STo in the program operation.

To decrease channel potential of the even cell strings STe with formation of a channel to the even cell strings STe, a second program pass voltage 2Vpass lower than a first program pass voltage 1Vpass is applied to a selected word line SelWL, which is connected to the memory cells to be programmed, and the other word lines UnselWL which is connected to the memory cells not programmed. For example, the second program pass voltage 2Vpass may be a voltage between the first program pass voltage 1Vpass and the ground voltage Vss. The second program pass voltage 2Vpass may have level lower than the first program pass voltage 1Vpass by channel voltage between the even cell strings STe and the odd cell strings STo in the program operation.

To deliver a voltage applied to the bit lines BLe and BLo to the cell strings STe and STo, a first drain turn-on voltage $1V_{DSL}$ or a second drain turn-on voltage $2V_{DSL}$ in FIG., which is lower than the first drain turn-on voltage $1V_{DSL}$ and higher than 0V, is provided to the drain select line DSL. For example, the second drain turn-on voltage $2V_{DSL}$ may be level lower than the first drain turn-on voltage $1V_{DSL}$ by difference of channel voltage between the even cell strings STe and the odd cell strings STo in the program operation.

In a case when a voltage corresponding to level of the ground voltage is applied to the common source line CSL in the program operation, a voltage corresponding to the level of the ground voltage is provided to the source select line SSL. In a case when a voltage corresponding to level of the supply voltage is applied to the common source line CSL, a voltage corresponding to the level of the supply voltage is provided to the source select line SSL.

Program Section T2 to T3

In a program section T2 to T3, to down channel voltage of the even cell strings STe, a second program voltage 2Vpgm higher than the first program pass voltage 1Vpass is applied to the selected word line SelWL. A threshold voltage of selected memory cells increases. For example, the second program voltage 2Vpgm may be higher than the first program pass voltage 1Vpass and lower than a first program voltage 1Vpgm. Particularly, the second program voltage 2Vpgm may have level lower than the first program voltage 1Vpgm by difference of channel voltage between the even cell strings STe and the odd cell strings STo.

A program verifying operation is performed after operation in the program section T2 to T3 is finished, which is not shown. In a case when the threshold voltage of the selected memory cells is not higher than a target voltage in the verifying operation, the present invention performs repetitively the operation in the channel forming section T1 to T2 in FIG. 7A, the operation in the program section T2 to T3 in FIG. 7A, and the program verifying operation for the even cell strings with increasing step-by-step the first program voltage 1Vpgm by a step voltage. In a case when the threshold voltage of the selected memory cells, which are included in the even cell strings STe and connected to the selected word line SelWL, is higher than the target voltage, a program operation is performed about selected memory cells in the odd cell strings STo.

Hereinafter, the program operation for the odd cell strings STo connected to the odd bit lines BLo will be described with reference to accompanying drawing FIG. 7B.

Channel Forming Section T1 to T2

In the channel forming section T1 to T2, a first program permission voltage $1V_{BLS}$ is applied to selected bit lines SelBL connected to memory cells to be programmed. A first program prohibition voltage $1V_{BLi}$ is provided to bit lines InhBL not selected and connected to memory cells not programmed. Since the program operation corresponds to a program operation for the odd cell strings STo, the selected bit lines SelBL are referred to as a bit line connected to the memory cells to be programmed of the odd bit lines BLo. The bit lines InhBL not selected have the other odd bit lines BLo and every even bit line BLe. For example, the first program permission voltage $1V_{BLS}$ may be level of a ground voltage Vss. The first program prohibition voltage $1V_{BLi}$ may be level of a supply voltage Vcc.

To form a channel to the odd cell strings STo, a first program pass voltage 1Vpass is applied to a selected word line SelWL, which is connected to the memory cells to be programmed, and the other word lines UnselWL which is connected to the memory cells not programmed.

To deliver a voltage applied to the bit lines BLe and BLo to the cell strings STe and STo, a first drain turn-on voltage $1V_{DSL}$ is provided to the drain select line DSL. For example, the first drain turn-on voltage $1V_{DSL}$ may be a voltage corresponding to the supply voltage Vcc.

In a case when a voltage corresponding to level of the ground voltage is applied to the common source line CSL in the program operation, a voltage corresponding to the level of the ground voltage is provided to the source select line SSL. In a case when a voltage corresponding to level of the supply voltage is applied to the common source line CSL, a voltage corresponding to the level of the supply voltage is provided to the source select line SSL.

Program Section T2 to T3

In a program section T2 to T3, a first program voltage 1Vpgm higher than the first program pass voltage 1Vpass is applied to the selected word line SelWL. A threshold voltage of selected memory cells increases.

A program verifying operation is performed after operation in the program section T2 to T3 is finished, which is not shown. In a case when the threshold voltage of the selected memory cells is not higher than a target voltage in the verifying operation, the present invention performs repetitively the operation in the channel forming section T1 to T2 in FIG. b, the operation in the program section T2 to T3 in FIG. 7B, and the program verifying operation for the odd cell strings with increasing step-by-step the first program voltage 1Vpgm by a step voltage. In a case when the threshold voltage of the selected memory cells, which are included in the odd cell strings STo and connected to the selected word line SelWL, is higher than the target voltage, the next word line is selected. The program operation is performed about memory cells connected to the selected word line like the above method.

As described above, when the program operation for the cell strings to be programmed earlier is performed, the program permission voltage and the program prohibition voltage which are applied to the bit lines, the program voltage provided to the selected word line, and the program pass voltage applied to the word lines not selected are adjusted. As a result, difference of channel potential between the program operations for cell strings to be programmed later may reduce. Accordingly, similar channel potential is formed irrespective of program order. Accordingly, reliability of the program operation may be improved.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A method of operating a semiconductor memory device, comprising:
    connecting selected even bit lines to selected even cell strings;
    programming memory cells in the selected even cell strings by using a second program permission voltage higher than a first program permission voltage;
    connecting selected odd bit lines to selected odd cell strings when programming of the memory cells is finished; and
    programming memory cells in the selected odd cell strings by using the first program permission voltage.

2. The method of claim 1, further comprising:
    applying one of a first program prohibition voltage and a second program prohibition voltage, which are higher than a ground voltage and lower than the first program prohibition voltage, into the other bit lines except the selected even bit lines while the memory cells in the selected even cell strings are programmed.

3. The method of claim 2, wherein the second program prohibition voltage is lower than the first program prohibition voltage by difference of channel voltage between the program operation of the even cell strings and the program operation of the odd cell strings.

4. The method of claim 1, wherein the second program permission voltage is higher than the first program permission voltage by difference of channel voltage between the program operation of the even cell strings and the program operation of the odd cell strings.

5. The method of claim 1 wherein the step of programming the memory cells in the selected even cell strings further includes:
    applying one of a first program pass voltage and a second program pass voltage, which are higher than a ground voltage and lower than the first program pass voltage, into every word line, to connect every bit line to every cell strings; and
    increasing threshold voltage of the memory cells in the selected even cell strings by applying one of a first program voltage and a second program voltage, which are lower than the first program voltage, into selected word line.

6. The method of claim 5, wherein the second program pass voltage which is higher than a ground voltage is lower than the first program pass voltage by difference of channel voltage between program operation of the even cell strings and program operation of the odd cell strings.

7. The method of claim 5, wherein the second program voltage is lower than the first program voltage by difference of channel voltage between program operation of the even cell strings and program operation of the odd cell strings.

8. The method of claim 5, wherein the step of connecting every bit line to every cell string further includes:
    applying one of a first drain turn-on voltage and a second drain turn-on voltage, which are lower than the first drain turn-on voltage, into a gate of a drain select transistor connected between each of the cell strings and a bit line.

9. The method of claim 8, wherein the first drain turn-on voltage corresponds to level of a supply voltage.

10. The method of claim 8, wherein the second drain turn-on voltage is lower than the first drain turn-on voltage by difference of channel voltage between program operation of the even cell strings and program operation of the odd cell strings.

11. The method of claim 1, wherein the step of programming the memory cells in the selected odd cell strings further includes:
    applying the first program permission voltage to the selected odd bit lines, and providing a first program prohibition voltage to the other bit lines;
    applying a first program pass voltage to every word line, and connecting every bit line to every cell string; and
    increasing threshold voltage of the memory cells in the selected odd cell strings by applying a first program voltage to selected word line.

12. A method of operating a semiconductor memory device, comprising:
    programming memory cells in selected even cell strings by applying a second program voltage which is lower than a first program voltage to selected word line; and
    programming memory cells in selected odd cell strings by applying the first program voltage to the selected word line, when the programming of the memory cells in the selected even cell strings is finished.

13. The method of claim 12, further comprising:
    connecting selected even bit lines to the selected even cell strings before the step of programming the memory cells in the selected even cell strings, wherein a second program permission voltage higher than a first program permission voltage is applied to the selected even bit lines.

14. The method of claim 13, wherein the first program permission voltage corresponds to level of a ground voltage.

15. The method of claim 13, wherein the second program permission voltage is higher than the first program permission voltage by difference of channel voltage between program operation of the even cell strings and program operation of the odd cell strings.

16. The method of claim 12, wherein the second program voltage is lower than the first program voltage by difference of channel voltage between program operation of the even cell strings and program operation of the odd cell strings.

17. The method of claim 12, further comprising:
    applying a second program pass voltage lower than a first program pass voltage to every word line before the step of applying the second program voltage to the selected word line.

18. The method of claim 17, wherein the second program pass voltage is lower than the first program pass voltage by difference of channel voltage between program operation of the even cell strings and program operation of the odd cell strings, and it is greater than a ground voltage.

19. A semiconductor memory device, comprising:
    a memory cell array configured to include even cell strings and odd cell strings;

a circuit group configured to program memory cells selected from the even cell strings and the odd cell strings; and a control circuit configured to control the circuit group to reduce difference of channel potentials of the even cell strings and the odd cell strings during a program operation.

20. The semiconductor memory device of claim 19, wherein the control circuit controls the circuit group to reduce difference of the channel potential of cell strings programmed earlier and other cell strings programmed later by decreasing the channel potential of the cell strings programmed earlier of the even cell strings and the odd cell strings.

21. The semiconductor memory device of claim 19, wherein the control circuit controls the circuit group to set a program permission voltage applied to selected bit lines in a program operation of cell strings programmed earlier of the even cell strings and the odd cell strings to have a voltage higher than a program permission voltage in a program operation of cell strings programmed later, set a program prohibition voltage applied to bit lines not selected in the program operation of the cell strings programmed earlier to have a voltage lower than a program prohibition voltage in the program operation of the cell strings programmed later, set a program voltage applied to selected word line in the program operation of the cell strings programmed earlier to have a voltage lower than a program voltage in the program operation of the cell strings programmed later, or set a program pass voltage applied to word lines not selected in the program operation of the cell strings programmed earlier to have a voltage lower than a program pass voltage in the program operation of the cell strings programmed later.

22. The semiconductor memory device of claim 21, wherein the circuit group includes:

page buffers for applying the program prohibition voltage or the program permission voltage to even bit lines connected to the even cell strings and odd bit lines connected to the odd cell strings in response to page buffer signals of the control circuit;

a voltage generation circuit for outputting the program voltage for performing a program operation of the selected memory cells to global lines in response to an operation signal which is an internal command signal of the control circuit; and a row decoder configured to deliver the program voltage to the selected word line in response to row address signals of the control circuit.

* * * * *